(12) United States Patent  
Faure

(10) Patent No.: US 8,263,984 B2
(45) Date of Patent: Sep. 11, 2012

(54) PROCESS FOR MAKING A GAN SUBSTRATE

(75) Inventor: Bruce Faure, Grenoble (FR)

(73) Assignee: Soitec, Bernin (FR)

( * ) Notice: Subject to any disclaimer, the term of this patent is extended or adjusted under 35 U.S.C. 154(b) by 469 days.

(21) Appl. No.: 12/310,345

(22) PCT Filed: Nov. 11, 2007

(86) PCT No.: PCT/EP2007/059500
§ 371 (c)(1),
(2), (4) Date: Feb. 20, 2009

(87) PCT Pub. No.: WO2008/031809
PCT Pub. Date: Mar. 20, 2008

(65) Prior Publication Data
US 2010/0012947 A1    Jan. 21, 2010

(30) Foreign Application Priority Data
Sep. 12, 2006    (FR) ...................................... 06 07950

(51) Int. Cl.
*H01L 29/15*    (2006.01)
*H01L 21/30*    (2006.01)
*C30B 25/00*    (2006.01)

(52) U.S. Cl. .............................. 257/76; 117/97; 438/458
(58) Field of Classification Search ........................ None
See application file for complete search history.

(56) References Cited

U.S. PATENT DOCUMENTS 3,904,449 A * 9/1975 DiLorenzo et al. ........... 438/380
6,468,882 B2 10/2002 Motoki et al.
2002/0102819 A1 * 8/2002 Tamura et al. ................ 438/483
2003/0057432 A1 * 3/2003 Gardner et al. ............... 257/100
2009/0101063 A1 * 4/2009 Okahisa ......................... 117/88

FOREIGN PATENT DOCUMENTS

| EP | 1 662 549 A | 5/2006 |
| FR | 2 843 626 A1 | 2/2004 |
| FR | 2 877 491 A1 | 5/2006 |
| JP | 2005515150 T | 5/2005 |
| WO | WO 2006/082467 | * 8/2006 |
| WO | WO 2006/082467 A1 | 8/2006 |

OTHER PUBLICATIONS

International Search Report in PCT/EP2007/059500, mailed Jan. 28, 2008, 4 pages.
Q-Y Tong and U Goesele, Semiconductor Wafer Bonding Science and Technology, a Wiley Interscience Publication, John Wiley & Sons, Inc., Dec. 1998, Title Page, Table of Contents, and Chapters 1, 4, 6, 7, 8, 9, and 10.
Jean-Pierre Colinge, Silicon-on-Insulator Technology: Materials to WLSI, Second Edition, Kluwer Academics Publishers, 1997, Title Page, Table of Contents, and pp. 1-5, and 7-65.
Morkoc et al., Large-Band-Gap SiC, III-V Nitride, and II-VI ZnSe-Based Semiconductor Device Technologies, J. Appl. Phys. vol. 76, No. 3, Aug. 1, 1994, pp. 1363-1398.

* cited by examiner

*Primary Examiner* — Melvin C Mayes
*Assistant Examiner* — Bijay Saha
(74) *Attorney, Agent, or Firm* — TraskBritt

(57) ABSTRACT

In some embodiments, the invention relates to a process for making a GaN substrate comprising: transferring a first monocrystal GaN layer onto a supporting substrate; applying crystal growth for a second monocrystal GaN layer on the first layer; the first and second GaN layers thereby forming together the GaN substrate, the GaN substrate having a thickness of at least 10 micrometers, and removing at least one portion of the supporting substrate.

20 Claims, 3 Drawing Sheets

PROCESS FOR MAKING A GAN SUBSTRATE

CROSS-REFERENCE TO RELATED APPLICATIONS

This application is a U.S. national phase entry under 35 U.S.C. §371 of International Application No. PCT/EP2007/059500, filed Sep. 11, 2007, published in English as PCT International Publication No. WO 2008/031809 A1 on Mar. 20, 2008, which is based upon and claims the priority of French Patent Application No. 0607950, filed Sep. 12, 2006, each of which application is incorporated herein in its entirety by this reference.

TECHNICAL FIELD

The invention relates to the making of a GaN substrate and at the very least to a thick GaN layer. By a thick layer, is meant a layer with a thickness larger than 10 micrometers.

BACKGROUND

Nitride compounds of the GaN, AlN, AlGaN, AlGaInN type, etc., have semi-conducting properties of the large direct gap type, notably used for applications in electronics or opto-electronics at a microscopic or nanoscopic scale. In particular, GaN has a direct gap of 3.4 eV that gives it the property of emitting light in the ultraviolet. Combined with materials such as aluminum or indium in order to modulate its gap, it is possible to make light-emitting diode or laser diode type structures emitting in the blue, the violet and the ultraviolet. One of these alloys emitting in the ultraviolet may also be combined with phosphorus in order to obtain an emission in the white, by using the fluorescent property of phosphorus.

The general interest for this type of material is therefore very large.

Therefore, the invention in particular relates to making a thick GaN layer with good crystal quality (i.e., free of dislocations), which may optionally be used as a substrate, for example, for a subsequent epitaxy (by substrate, is meant in this text an entity that is able to bear the conditions of an epitaxy and that is flat enough to allow a good quality of the epitaxy, i.e., to grow an epitaxied layer that is flat, without cracks and with a low density of dislocations). Thick GaN films with low rates of dislocations, allow high-performance components to be made with longer life-times.

The high rate of dislocations is today one of the main technical limitations for improving performances of nitride-based components.

It is notably very difficult to obtain GaN substrates on the market of proper quality in a sufficient size for considering industrialization.

Making GaN layers by growing crystals on supporting substrates of the sapphire ($Al_2O_3$), SiC or silicon type is thus known.

However, lattice mismatches and differences in temperature behavior (different thermal expansion coefficients) between the different present materials are such that stresses are generated in the GaN layer, with appearance of defects of the dislocation type and other ones.

When the thickness of the epitaxied layer is too large for allowing it to expand or to retract, the cumulated elastic energy may even lead to cracking the GaN layer completely and thereby making it unusable.

The lattice mismatch problem may be limited by inserting between the supporting substrate and the GaN layer, intermediate layers (so-called "buffer layers") with at least one layer typically consisting of at least two of the following elements: Al, Ga, As, In and N. These intermediate layers thus have the main purpose of reducing the impact of lattice parameter differences between the supporting substrate and the GaN layer.

By providing improvements to these so-called "hetero-epitaxy" methods on an SiC, a sapphire, or silicon substrate, it was thereby possible to make functional components.

However, certain electro-optical characteristics remain insufficient, such as emitted light power, leak current, life-time, etc.

Further, the making of such composite structures is long and expensive.

Moreover, with hetero-epitaxy, it is not always possible to totally get rid of the problems related to mechanical interaction (thermal expansion) between the substrate and the GaN layer.

European Patent EP 0 967 664 proposes another technique for making a thick GaN layer by homo-epitaxy on a GaAs supporting substrate, compatible with GaN epitaxy in terms of thermal expansion (the thermal expansion coefficient of GaAs being relatively close to that of GaN). The applied method comprises low temperature Epitaxial Lateral Over-growth (also called ELOG) of a first GaN layer on a bulk GaAs substrate covered with an $SiO_2$ mask in relief, followed by thickening of this first GaN layer by crystal growth.

After epitaxy, the GaAs substrate is suppressed by selective etching, for example, by using aqua regia, obtained by mixing nitric acid and hydrochloric acid.

Indeed, it may often be desirable to separate the GaN layer from the underlying structure in order to preserve the thick epitaxied GaN layer as a substrate layer, and this without having to sacrifice too much thickness from the GaN layer. For this purpose, a particularly selective etching of the substrate is a very efficient technique.

However, if selecting a GaAs substrate, it may be advisable to apply selective etching from a point of view of the mechanical behavior with temperature; it is less so from a crystallographic point of view. Indeed, the lattice mismatch with GaN is so large that it is necessary to make a sacrificial GaN layer on the GaAs substrate, prior to depositing a second GaN layer. For this purpose, the $SiO_2$ mask in relief is first made so as to cause in the first GaN layer to be epitaxied laterally to the mask reliefs, confinement of a large number of defects, the latter thus playing the role of a sacrificial layer, before being used as a nucleation layer for the second GaN layer.

Now, making this last mask extends the manufacturing method in time, by adding additional steps thereto for forming a layer and for $SiO_2$ photolithography according to pre-determined patterns favorable to lateral growth of GaN.

These additional steps are further expensive to apply.

Finally, the first GaN layer, which is then epitaxied, remains of such poor crystal quality that it is necessary to epitaxy a strong layer of GaN in order to attain good crystal quality and a rate of dislocations less than $10^8$ dislocations/$cm^2$.

A goal of the invention is to make a thick GaN layer typically thicker than 10 micrometers, with good crystal quality (i.e., a number of dislocations less than $10^8$ dislocations/$cm^2$), by applying a faster and less expensive method.

Another goal is to avoid too large of losses of materials in the method for making the GaN layer.

For this purpose, the invention proposes a process for making a GaN substrate, comprising the following steps:
 (a) transferring a first monocrystal GaN layer onto a supporting substrate;

(b) applying crystal growth for a second monocrystal GaN layer on the first layer;

the first and second GaN layers thereby forming together said GaN substrate, said GaN substrate having a thickness of at least 10 micrometers, and (c) removing at least one portion of the supporting substrate.

Other characteristics of this process are the following:

the difference in thermal expansion coefficients between GaN and the material(s) making up the supporting substrate is between about $0.1 \cdot 10^{-6}$ and about $2 \cdot 10^{-6} K^{-1}$ for temperatures between about 20° C. and about 500° C.;

the supporting substrate has at least one surface layer in germanium or in an alloy made up of materials selected from the family of III-V materials; the supporting substrate may be in bulk GaAs;

prior to step (a), the process may comprise forming a protective coating on the supporting substrate; the protective coating may in particular be in a dielectric material, such as $SiO_2$;

the protective coating is an encapsulation entirely surrounding the supporting substrate, or a protective layer formed on the face of the supporting substrate to be bonded to the first GaN layer; step (c) is a selective chemical etching of the encapsulation;

step (a) may comprise the formation of a bonding layer on one or both bonding surfaces, before putting the supporting substrate and the first GaN layer into contact; the bonding layer may in particular be in $SiO_2$ or $Si_3N_4$;

step (c) comprises a selective chemical etching of the layer located at the interface between the supporting substrate and the first GaN layer, or selective chemical etching of at least one portion of the supporting substrate;

if the supporting substrate is in GaAs, the chemical etching agent is preferably aqua regia;

according to a preferred embodiment, the etching is achieved in the same enclosure as for the growth step (b) without having to handle the layers/supporting substrate assembly; the chemical etching agent is gaseous hydrochloric acid;

the process may further comprise, after step (c), a step of epitaxial growth on the GaN substrate;

the first GaN layer has a thickness between about 500 angstroms and about 1 micrometer;

the first GaN layer is initially comprised in an upper GaN layer of an initial structure, step (a) then allows bonding not only of the first layer but also of the whole initial structure to the supporting substrate, and the process further comprises, after step (a), a step for removing the initial structure located under the first GaN layer;

the step for removing the structure located under the first GaN layer is mainly applied by SMART CUT®, an implantation of atomic species having been applied beforehand into said upper layer to a thickness close to the thickness of said first GaN layer.

The invention also proposes a GaN substrate on GaAs, characterized in that the GaN substrate has a density of dislocations less than about $10^8$ dislocations/$cm^2$ and has a thickness larger than about 10 micrometers.

The invention further proposes a GaN substrate having a density of dislocations less than about $10^8$ dislocations/$cm^2$ and a thickness comprised between 10 and 100 micrometers.

BRIEF DESCRIPTION OF THE DRAWINGS

Other features, objects and advantages of the invention will be better understood in the non-limiting description which follows, illustrated by the following drawings.

DETAILED DESCRITION

Figure 1:
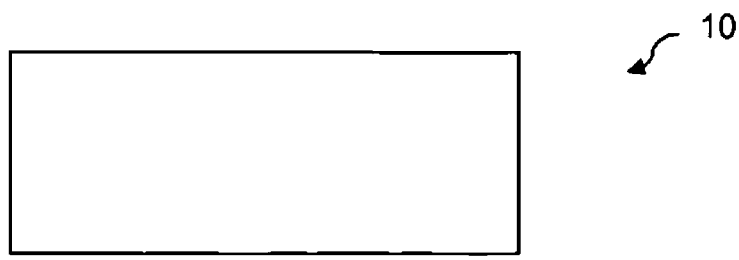
FIGS. 1-5 respectively illustrate different successive steps for making a GaN substrate according to the invention.

With reference to FIGS. 1-5, a preferred method for making a GaN substrate according to the invention comprises the following steps:

using an initial structure 10 including a surface GaN layer with a low rate of dislocations (typically less than $10^8$ disloc./$cm^2$);

bonding this initial structure 10 with a supporting substrate 40;

reducing the initial structure 10 so as to only retain said GaN surface layer 50 or a portion of the latter; and epitaxially growing a second GaN layer on the GaN surface layer 50 so as to form together a GaN layer 60 with sufficient thickness in order to make said GaN substrate 60, which one desires to obtain.

Then, an additional step for removing at least one portion of the supporting substrate 40 is applied in order to only retain said GaN substrate 60. It is possible to remove either the whole supporting substrate 40 or a portion of it, provided that the remaining portion is so thin that it does not have any influence on the subsequent epitaxy (i.e., the presence of said portion of the supporting substrate 40 does not induce strains in the layer epitaxied on the GaN substrate 60 due to different thermal expansion coefficients). Typically, the thickness of the remaining portion of the supporting substrate 40 is less than the thickness of the GaN substrate 60. Furthermore, such a thin portion of the supporting substrate 40 does not have influence on the mechanical strength of the GaN substrate 60 and does not contribute to reinforce the GaN substrate 60 in order to bear the epitaxy. However, it can be interesting not to remove completely the supporting substrate 40 because the duration of the removal of the supporting substrate 40 can thus be shortened.

Thus, it is possible to obtain a thick GaN layer 60 (a thickness typically larger than 10 μm) with very good crystal quality (typically a number of dislocations less than $10^8$ dislocations/$cm^2$), for a lesser manufacturing cost than that of the methods according to the state of the art.

With reference to FIG. 1, the initial structure 10 corresponds to a bulk GaN substrate. GaN, a binary material, conventionally appears as a polar material, with a particular orientation of the crystal lattice cells of the material. This orientation is expressed at both surfaces of the substrate by an asymmetry: one of the faces will be said to be a Ga face; whereas the other opposite face will be said to be an N face.

It is known that growing an active layer of electronic components on polar GaN material is easier to achieve with good quality by starting with a so-called "Ga face" than with a so-called "N face".

Figure 2:
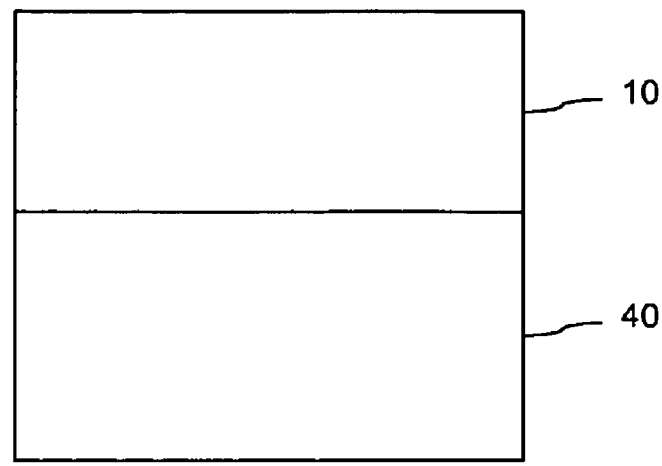

With reference to FIG. 2, the initial structure 10 is bonded to a supporting substrate 40.

The material(s) making up the supporting substrate 40 is (are) selected so that the thermal expansion coefficient difference between the supporting substrate 40 and the GaN of structure 10 is between $0.1 \cdot 10^{-6}$ and $2 \cdot 10^{-6} K^{-1}$ between room temperature and about 500° C.

Thus, by means of this selection of materials forming the supporting substrate 40, it will be possible to apply relatively high heat treatments such as those which might be used in the bonding, epitaxy, or chemical etching step, without causing substantial deteriorations at the surface of the GaN structure 10.

Thus, a supporting substrate 40 in an alloy consisting of materials selected from the family of III-V materials from the periodic table but also in germanium may be selected.

In particular, the growth substrate 40 is entirely made in bulk GaAs.

Figure 3A:
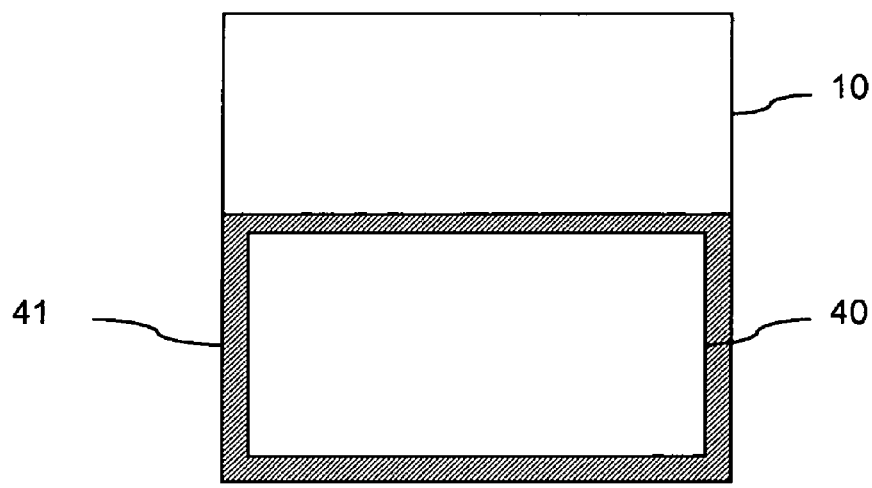
Figure 3B:
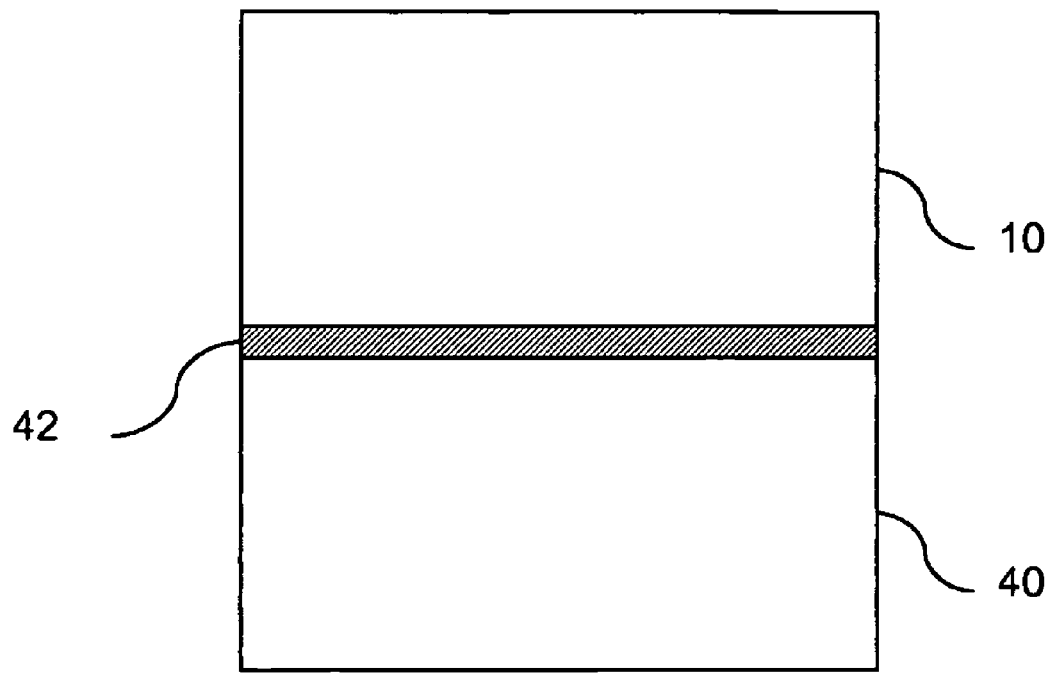

In the case when the supporting substrate 40 is in GaAs, a protective coating of the supporting substrate 40 is preferentially formed, prior to the bonding, all around the supporting substrate 40 in order to protect it during the bonding and subsequent epitaxy and forms an encapsulation 41 as shown in FIG. 3A. Another alternative consists of only forming this protective coating on the surface to be bonded of the supporting substrate 40. The the protective coating is thus a protective layer 42 shown in FIG. 3B.

This coating may be selected from dielectric materials, such as $SiO_2$, in order to form a capping.

Figure 3C:
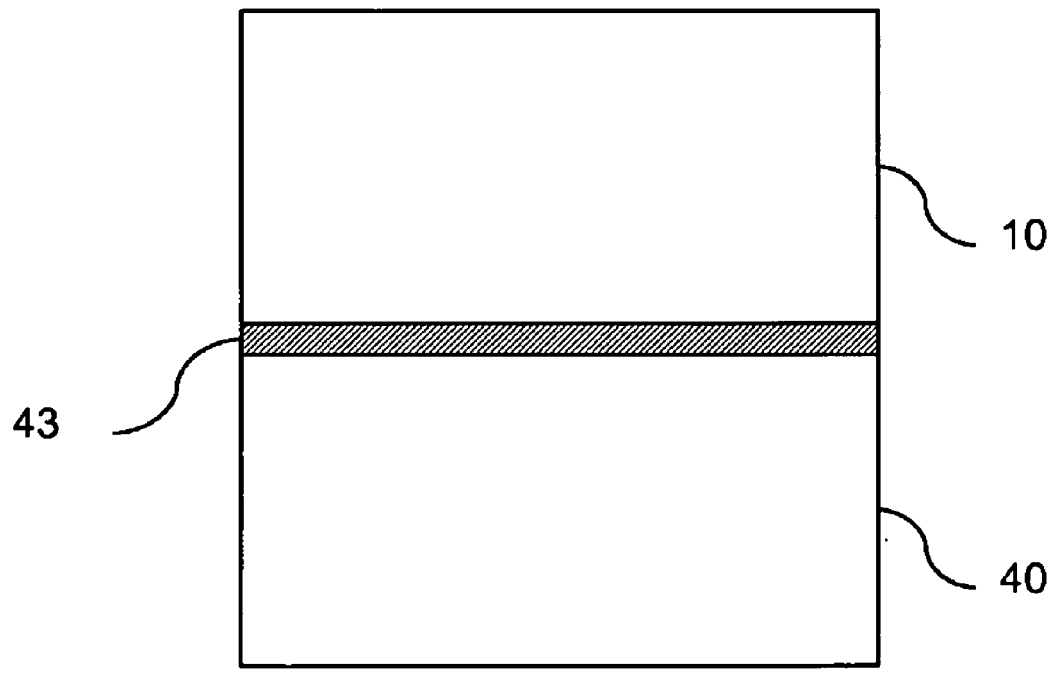

Referring to FIG. 3C, prior to bonding, a bonding layer 43 may be formed on one or both of the bonding surfaces, before putting the supporting substrate 40 and the structure 10 into contact.

The bonding layer 43 may be in $SiO_2$, $Si_3N_4$, $Si_xO_yN_z$, or in other types of materials ordinarily used in such a step.

Specifications may notably be found in *Semiconductor Wafer Bonding Science and Technology* (Q.-Y. Tong and U. Goesele, a Wiley Interscience Publication, John Wiley & Sons, Inc.).

In particular, the bonding may comprise a suitable heat treatment in order to strengthen the bonding links at the interface between the structure 10 and the supporting substrate 40.

Figure 4:
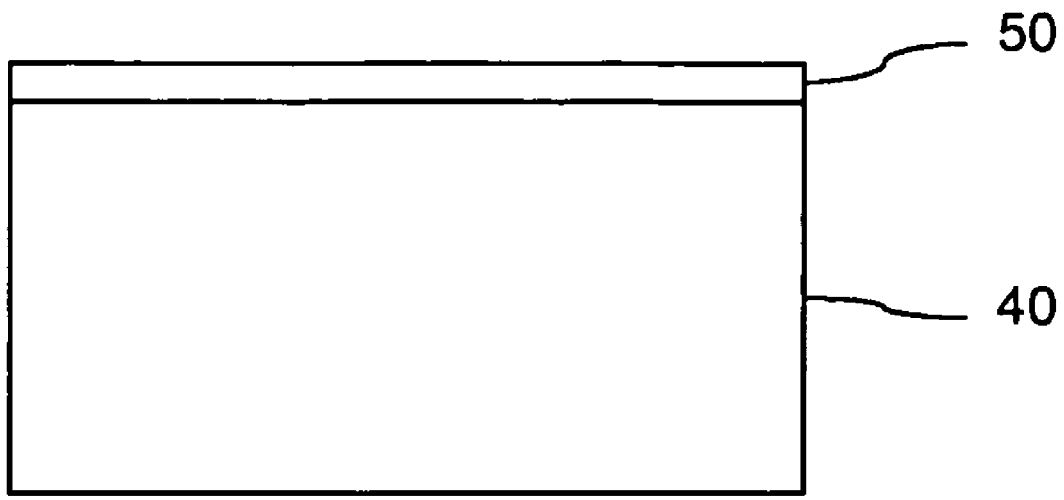

With reference to FIG. 4, a step for reducing the initial structure 10 is applied so as to only retain a GaN surface layer 50, with a low rate of defects and/or dislocations, typically less than $10^8$ dislocations/cm².

For example, a surface layer may thereby be obtained with a thickness between about 500 angstroms and about 1 micrometer.

This reduction step may be applied according to at least one technique from the following, either taken alone or in a combination together: chemical etching, optionally selective etching, SMART CUT®, polishing, BESOI.

These different techniques, very well-known to one skilled in the art, may notably be found again in the textbook *Silicon-on-Insulator Technology: Materials to WLSI*, 2$^{nd}$ ed., by Jean-Pierre Colinge (Kluwer Academics Publishers, pp. 50 and 51).

In particular, the use of the SMART CUT® technique within the scope of the invention preferentially comprises the following steps:
  prior to the bonding step, forming an embrittlement area in the substrate 10 by implanting or co-implanting atomic species such as hydrogen and/or helium, at a depth substantially equal to the desired thickness of the desired surface layer 50;
  providing energy such as heat and/or mechanical energy at the embrittlement area in order to detach the layer 50 from it;
  an optional finishing step for obtaining a satisfactory surface condition and thickness homogeneity. For this purpose, polishing, CMP and/or, optionally, selective chemical etching may be applied.

The use of the SMART CUT® technique notably has the advantage of being able to recover, after the step for detaching the layer 50, the remaining portion of the initial structure 10, so as to reuse it subsequently, for taking another layer sample (after optional recycling and a step for growing another GaN layer). This is particularly advantageous in the case when this initial structure 10 is long and expensive to make.

Another technique may consist of chemical etching, optionally selective etching, by etching the rear face of the structure 10, optionally keeping one portion.

Figure 5:
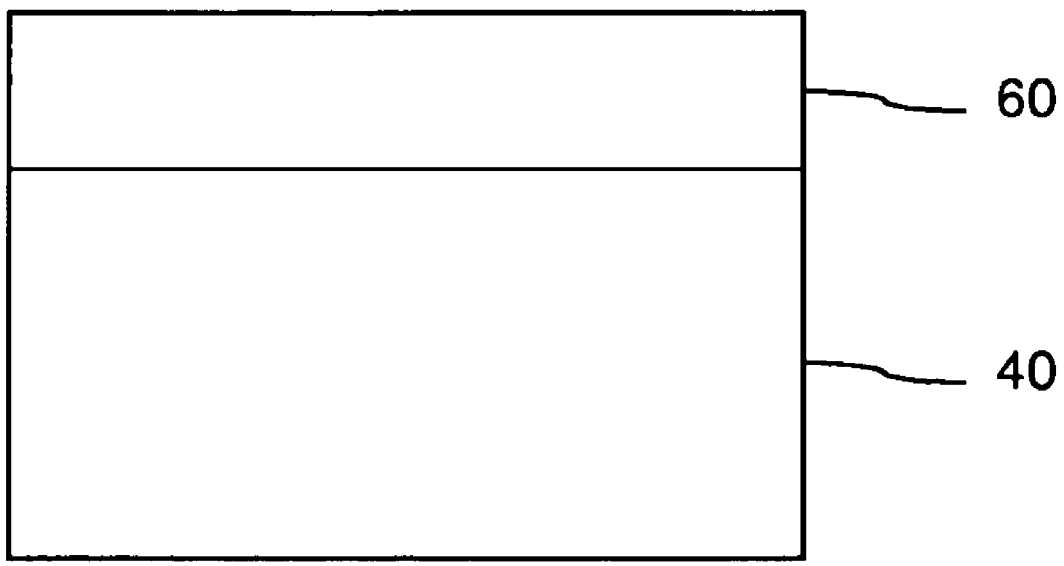

With reference to FIG. 5, a crystal growth step for a second GaN layer on the first GaN layer 50 is applied so as to obtain a GaN layer with sufficient thickness so as to achieve by itself a substrate 60.

This thickness may typically be larger than 10 μm.

Thus, the first GaN layer 50 is used as an initiator for growing the second GaN layer, imposing to the latter, its crystal parameter and its intrinsic crystallographic quality. Moreover, the face of the substrate 10 used for taking up the layer 50 has a polarity with which, after the transfer process, a polarity may be obtained which is compatible with resuming epitaxy, i.e., a Ga polarity.

Thus, by means of the method for forming and transferring the first layer 50 onto the supporting layer 40, as detailed earlier, this first layer 50 has very good crystal quality (in particular a low density of dislocations), and a substrate 60 of high quality is then obtained.

Further, given that an epitaxy method is used here, on a quality initiator layer 50, it is possible to make a growth substrate 60 that is not limited in thickness and the quality of which is good and constant in thickness.

Finally, with the layer transfer technique according to the invention, it is possible not to be limited in selecting the supporting substrate 40. A material may thus be selected, which has temperature expansion properties close to those of GaN. Better mechanical strength of the layers 50 and 60 at high temperatures is thereby obtained, so that application of a larger range of techniques may be contemplated, during the different steps for making the substrate 60 (epitaxy, bonding, etching, etc.).

A further step of the method according to the invention consists of removing at least one portion of the supporting substrate 40 so as only to retain the GaN substrate 60 (or the GaN substrate 60 with a remaining portion of the supporting substrate 40 so thin that it does not influence the subsequent epitaxy).

This step for removing the supporting substrate 40 may be achieved by chemical or gas etching of the latter on the rear face, by selective chemical etching of the bonding layer or of the protective layer optionally formed between the GaN substrate 60 and the supporting substrate 40, or by any other technique capable of removing this supporting substrate 40.

If the supporting substrate 40 is completely encapsulated by a protective coating, a selective chemical etching of this coating can be achieved. For example, if the encapsulation 41 is in $SiO_2$, hydrofluoric acid (HF) is preferably used.

If there is a bonding layer 43 or a protective layer 42 at the bonding interface between the supporting substrate 40 and the GaN substrate 60, it is also possible to selectively etch and remove the layer 43 or 42. The supporting substrate 40 can thus be separated from the GaN substrate 60, and possibly be recycled.

Another method to remove the supporting substrate 40 is a chemical etching of the supporting substrate 40. In this case, if a protective or bonding layer had been formed at the interface between the supporting substrate 40 and the GaN substrate 60, this layer may not be removed during the etching, and may remain on the rear face of the GaN substrate 60, but its presence does not affect the subsequent epitaxy.

In the case when the supporting substrate 40 comprises at least partly GaAs, aqua regia may be used for applying selective etching of GaAs with regard to GaN.

In the preceding cases (so-called "ex situ etching"), the GaN substrate 60 shall be of a sufficient thickness in order to be "free-standing," i.e., the GaN substrate 60 shall have a sufficient mechanical stiffness to be moved without being damaged. Typically, the thickness of a free-standing substrate is of at least about 100 micrometers.

According to a particular embodiment of the invention, the selective etching step of the supporting substrate 40 is applied at a high temperature (typically from 500° C. to 1100° C.) directly subsequently to and/or during the epitaxy step for the second GaN layer in order to form said GaN substrate 60.

This step for removing the supporting substrate 40 may thereby be achieved in the same epitaxy enclosure than used for growing the GaN substrate 60, without any need for handling the whole of the layers/substrates. For that purpose, it is only necessary to have both of these steps follow each other by changing the nature of the gases introduced into the enclosure. During epitaxy of GaN, the gases used may, for example, be: a mixture of $NH_3$, $H_2$, and TMGa for low growth rates obtained in MOCVD or else a mixture of $NH_3$, $H_2$, and $GaCl_2$ for high growth rates in HVPE. After epitaxy, gaseous hydrochloric acid is introduced in the epitaxy enclosure with gaseous $H_2$ and etches the supporting substrate 40—provided that the supporting substrate 40 is not completely encapsulated by a protective coating. The temperature may also be varied.

The removal of the supporting substrate 40 in the epitaxy enclosure (so-called "in situ etching") advantageously allows the fabrication of a less thick GaN substrate 60 than a free-standing GaN substrate. Indeed, as the GaN substrate 60 does not need to be moved before the subsequent epitaxy, it is not necessary for it to be free-standing, a lower thickness—typically, about 10 micrometers that forms a thick layer—is sufficient to bear the epitaxy. On the contrary, a thin GaN film (less than 10 micrometers, typically about 1 or 2 micrometers) does not have a sufficient mechanical strength and is too fragile to bear an epitaxy without being supported by a supporting substrate.

After in situ etching of the supporting substrate 40, the GaN substrate 60, due to its thickness and its growth mode, remains flat because it is free from internal stresses, has a good crystallographic quality and is ready for a subsequent epitaxy in the same epitaxy enclosure. Furthermore, stresses due to different thermal expansion coefficients are avoided thanks to the absence of the supporting substrate. This GaN substrate can be fabricated faster than by other techniques, because it is thinner than substrates having the same crystallographic quality but made by other techniques.

This application is notably appreciable in an industrial context, as it provides a gain in time and in costs.

One skilled in the art will understand that this particular description of the invention is not limiting, and is only an illustrative example of a more general method for applying the invention. In particular, he or she may generalize a method according to the invention to types of materials other than those forming the supporting 40 and structure 10 substrates here, and to types of structures other than the initial structure 10.

Further, the different layers and substrates described here may comprise other elements, such as doping elements or oxidized elements.

The invention claimed is:

1. A method of making a GaN substrate, comprising:
    transferring a first monocrystal GaN layer onto a supporting substrate;
    growing a second monocrystal GaN layer on the first monocrystal GaN layer, the first and second monocrystal GaN layers together forming the GaN substrate, the GaN substrate having a thickness of at least 10 micrometers; and
    removing at least one portion of the supporting substrate.

2. The method of claim 1, wherein a difference in thermal expansion coefficients of the GaN substrate and the supporting substrate is between about $0.1 \cdot 10^{-6}$ and about $2 \cdot 10^{-6}$ $K^{-1}$ over a range of temperatures extending from about 20° C. to about 500° C.

3. The method of claim 1, wherein the supporting substrate has at least one surface layer comprising germanium or a III-V semiconductor material.

4. The method of claim 3, wherein the supporting substrate comprises bulk GaAs.

5. The method of claim 1, further comprising forming a protective coating on the supporting substrate prior to transferring the first monocrystal GaN layer onto the supporting substrate.

6. The method of claim 5, wherein the protective coating comprises a dielectric material.

7. The method of claim 5, wherein the protective coating entirely surrounds the supporting substrate.

8. that the method of claim 7, wherein removing the at least one portion of the supporting substrate comprises chemically etching the protective coating.

9. The method of claim 5, wherein forming the protective coating on the supporting substrate comprises forming the protective coating on a face of the supporting substrate to be bonded to the first monocrystal GaN layer.

10. The method of claim 1, wherein transferring the first monocrystal GaN layer onto the supporting substrate comprises forming a bonding layer on at least one of a bonding surface of the monocrystal GaN layer and a bonding surface of the supporting substrate before contacting the supporting substrate with the first monocrystal GaN layer.

11. The method of claim 10, wherein the bonding layer comprises $SiO_2$ or $Si_3N_4$.

12. The method of claim 9, wherein removing the at least one portion of the supporting substrate comprises chemically etching at least a portion of the protective coating located at an interface between the supporting substrate and the first monocrystal GaN layer.

13. The method of claim 9, wherein removing the at least one portion of the supporting substrate comprises chemically etching at least one portion of the supporting substrate.

14. The method of claim 13, wherein chemically etching the at least one portion of the supporting substrate comprises etching the at least one portion of the supporting substrate using aqua regia.

15. The method of claim 13, wherein chemically etching the at least one portion of the supporting substrate comprises chemically etching the at least one portion of the supporting substrate in an enclosure in which the second monocrystal GaN layer is grown on the first monocrystal GaN layer without handling the supporting substrate between chemically etching the at least one portion of the supporting substrate and growing the second monocrystal GaN layer on the first monocrystal GaN layer.

16. The method of claim 15, wherein chemically etching the at least one portion of the supporting substrate comprises etching the at least one portion of the supporting substrate using gaseous hydrochloric acid.

17. The method of claim 1, further comprising epitaxial growth of additional material on the GaN substrate.

18. The method of claim 1, wherein the first monocrystal GaN layer has a thickness between about 500 angstroms and about 1 micrometer.

19. A method as recited in claim 1, wherein transferring a first monocrystal GaN layer onto a supporting substrate comprises:
   bonding an initial structure comprising the first monocrystal GaN layer to the supporting substrate; and
   removing a portion of the initial structure from the first monocrystal GaN layer and leaving the first monocrystal GaN layer on the supporting substrate.

20. The method of claim 19, further comprising implanting ions into the initial structure and forming an embrittlement area within the initial structure, and wherein removing the portion of the initial structure from the first monocrystal GaN layer comprises imputing energy into the embrittlement area.

\* \* \* \* \*

UNITED STATES PATENT AND TRADEMARK OFFICE
CERTIFICATE OF CORRECTION

| | | |
|---|---|---|
| PATENT NO. | : 8,263,984 B2 | Page 1 of 1 |
| APPLICATION NO. | : 12/310345 | |
| DATED | : September 11, 2012 | |
| INVENTOR(S) | : Bruce Faure | |

It is certified that error appears in the above-identified patent and that said Letters Patent is hereby corrected as shown below:

On the title page:
In ITEM (22) PCT FILED:   change "Nov. 11, 2007" to --Sep. 11, 2007--

In the specification:
COLUMN 1,   LINE 10,   change "20 , 2008, which" to --20, 2008, which--

In the claims:
CLAIM 14, COLUMN 8,   LINE 49,   change "using aqua regia." to --using *aqua regia*.--

Signed and Sealed this
Twenty-seventh Day of November, 2012

David J. Kappos
*Director of the United States Patent and Trademark Office*